(12) United States Patent
Gerhard et al.

(10) Patent No.: US 7,701,131 B2
(45) Date of Patent: Apr. 20, 2010

(54) ORGANIC ELECTROLUMINESCENT ELEMENT COMPRISING A CARBONYL MATRIX MATERIAL

(75) Inventors: Anja Gerhard, Veitschöchheim (DE); Philipp Stössel, Frankfurt (DE); Horst Vestweber, Gilserberg-Winterscheid (DE)

(73) Assignee: Merck Patent GmbH, Darmstadt (DE)

( * ) Notice: Subject to any disclaimer, the term of this patent is extended or adjusted under 35 U.S.C. 154(b) by 602 days.

(21) Appl. No.: 10/565,488

(22) PCT Filed: Jul. 20, 2004

(86) PCT No.: PCT/EP2004/008070

§ 371 (c)(1),
(2), (4) Date: Apr. 11, 2006

(87) PCT Pub. No.: WO2005/011013

PCT Pub. Date: Feb. 3, 2005

(65) Prior Publication Data

US 2006/0175958 A1 Aug. 10, 2006

(30) Foreign Application Priority Data

Jul. 21, 2003 (DE) ................. 103 33 232

(51) Int. Cl.
*H01J 1/62* (2006.01)

(52) U.S. Cl. ...................... 313/504; 428/690

(58) Field of Classification Search ......... 313/498–512; 428/690
See application file for complete search history.

(56) References Cited

U.S. PATENT DOCUMENTS

| 6,166,489 | A | 12/2000 | Thompson et al. |
| 7,211,823 | B2* | 5/2007 | Tung et al ...................... 257/40 |
| 2001/0051207 | A1* | 12/2001 | Yamagata et al. ............. 427/58 |
| 2002/0125818 | A1 | 9/2002 | Sato et al. |
| 2004/0062947 | A1* | 4/2004 | Lamansky et al. .......... 428/690 |

(Continued)

FOREIGN PATENT DOCUMENTS

EP 1 154 498 A2 11/2001

(Continued)

OTHER PUBLICATIONS

Gang Cheng et al., "White organic Light-Emitting Devices Using a Phosphorescent Sensitizer," Applied Physics Letters, 82(24):4224-4226 (Jun. 16, 2003).

(Continued)

*Primary Examiner*—Joseph L Williams
(74) *Attorney, Agent, or Firm*—Hamilton, Brook, Smith & Reynolds, P.C.

(57) ABSTRACT

The invention relates to organic electroluminescent devices, comprising at least two mutually-defining emission layers, whereby said layers emit different wavelengths of light. Said electroluminescent device is characterized in that at least one of the emitter layers contains at least one phosphorescent layer.

24 Claims, 2 Drawing Sheets

EL spectrum for Example 1.

U.S. PATENT DOCUMENTS

| | | | |
|---|---|---|---|
| 2004/0095064 A1* | 5/2004 | Lu | 313/504 |
| 2004/0185300 A1* | 9/2004 | Hatwar et al. | 428/690 |
| 2004/0197600 A1* | 10/2004 | Thompson et al. | 428/690 |
| 2004/0214036 A1* | 10/2004 | Bentsen et al. | 428/690 |
| 2004/0214037 A1* | 10/2004 | Roberts et al. | 428/690 |
| 2005/0260439 A1* | 11/2005 | Shiang et al. | 428/690 |
| 2006/0033115 A1* | 2/2006 | Blochwitz et al. | 257/94 |
| 2006/0084347 A1* | 4/2006 | Tutt et al. | 445/24 |
| 2006/0152165 A1* | 7/2006 | Salata | 315/169.3 |
| 2006/0175957 A1* | 8/2006 | Suzuri et al. | 313/504 |
| 2006/0175958 A1* | 8/2006 | Gerhard et al. | 313/504 |
| 2006/0231843 A1* | 10/2006 | Qin et al. | 257/79 |

FOREIGN PATENT DOCUMENTS

| | | |
|---|---|---|
| WO | WO 99/26730 | 6/1999 |
| WO | WO 01/29909 A1 | 4/2001 |
| WO | WO 02/074015 A2 | 9/2002 |

OTHER PUBLICATIONS

Deshpande, R. S., et al., "White-Light-Emitting Organic Electroluminescent Devices Based on Interlayer Sequential Energy Transfer," *Applied Physics Letters*, 75:7, pp. 888-890 (1999).

\* cited by examiner

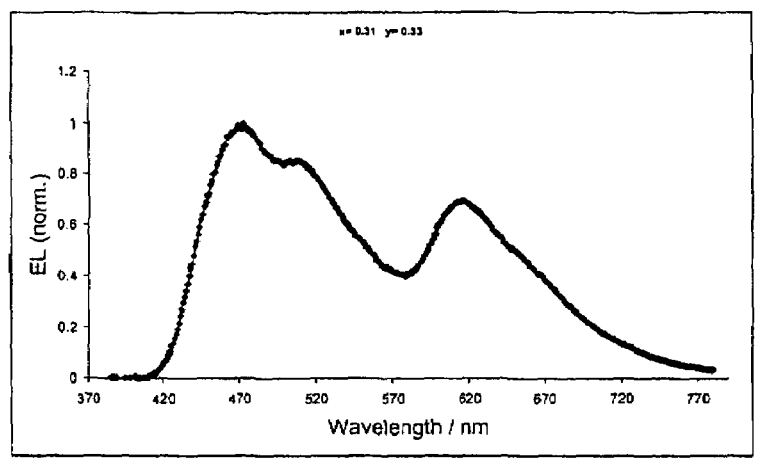
Figure 1: EL spectrum for Example 1.
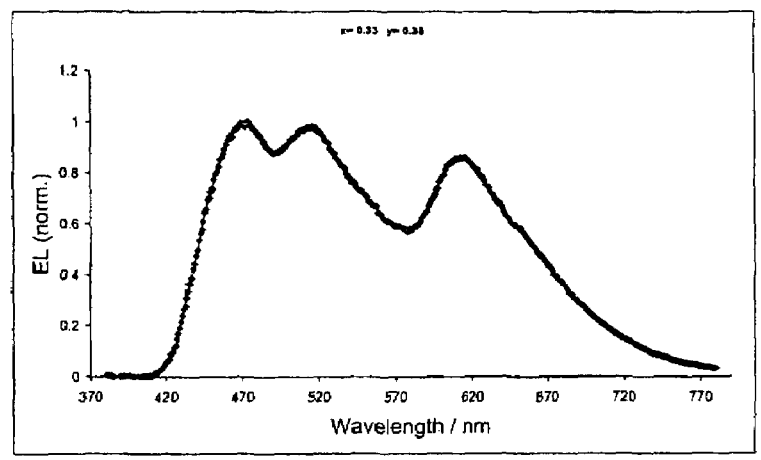
Figure 2: EL spectrum for Example 2.
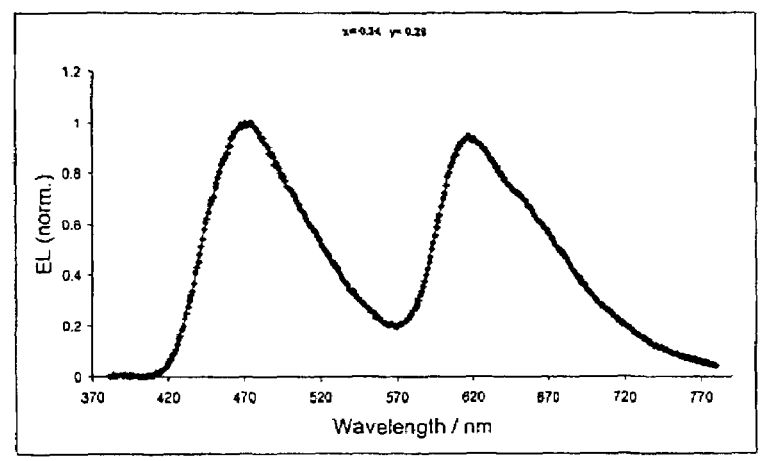
Figure 3: EL spectrum for Example 3.

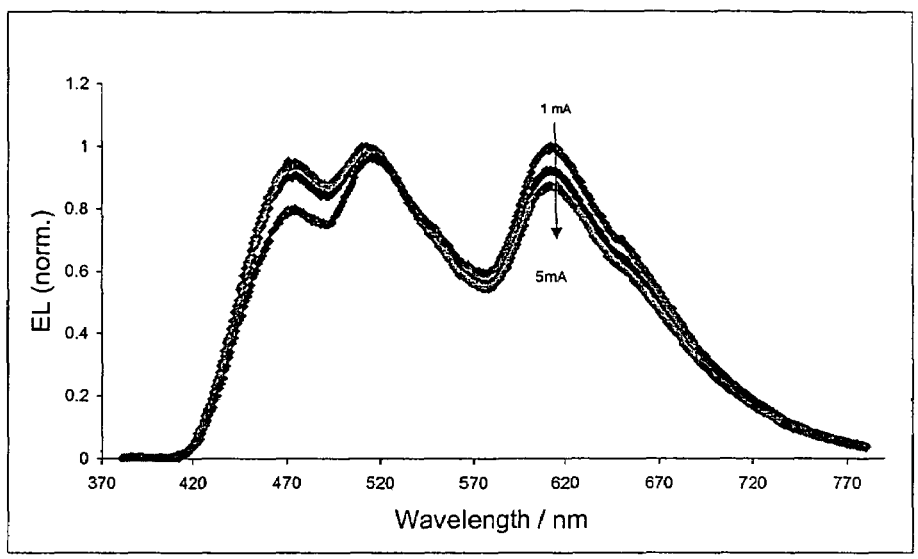
Figure 4: Variation of the current by a factor of 5 (OLED according to Example 2).

ORGANIC ELECTROLUMINESCENT ELEMENT COMPRISING A CARBONYL MATRIX MATERIAL

RELATED APPLICATIONS

This application is the U.S. National Stage of International Application No. PCT/EP2004/008070, filed Jul. 20, 2004, published in German, and claims priority under 35 U.S.C. §365 to German Application No. 103 33 232.4, filed Jul. 21, 2003.

The present invention describes a new type of design principle for organic electroluminescent elements and the use thereof in displays based thereon.

In a series of different types of applications which can be classified within the electronics industry in the widest sense, the use of organic semiconductors as functional materials has become reality in recent times or is expected in the near future.

For instance, light-sensitive organic materials (e.g. phthalocyanines) and organic charge transport materials (generally triarylamine-based hole transporters) have already found use for several years in copying machines.

The use of specific semiconducting organic compounds, some of which are also capable of emission of light in the visible spectral region, is just starting to be introduced onto the market, for example in organic electroluminescent devices. Their individual components, the organic light-emitting diodes (OLEDs), have a very wide spectrum of application as:

1. white or colored backlighting for monochrome or multi-color display elements (for example in pocket calculators, mobile telephones and other portable applications),
2. large-surface area displays (for example traffic signs, billboards and other applications),
3. illumination elements in all colors and forms,
4. monochrome or full-color passive matrix displays for portable applications (for example mobile telephones, PDAs, camcorders and other applications),
5. full-color, large-surface area, high-resolution active matrix displays for a wide variety of applications (for example mobile telephones, PDAs, laptops, televisions and other applications).

The development of some of these applications is already very far advanced; nevertheless, there is still great need for technical improvements.

Devices containing relatively simple OLEDs have already been introduced onto the market, as demonstrated by the car radios from Pioneer, a mobile telephone from SNMD or a digital camera from Kodak with an organic display. However, there are still considerable problems which are in need of urgent improvement:

1. For instance, the operative lifetime in particular of OLEDs is still low, so that it has only been possible to date to commercially realize simple applications.
2. This relatively short lifetime gives rise to a further problem: specifically for full-color applications (full-color displays), i.e. displays which do not have any segmentations, but rather can show all colors over the whole surface, it is particularly bad when the individual colors age here at different rates, as is currently the case. This leads, even before the end of the abovementioned lifetime (which is generally defined by a decline to 50% of the starting brightness), to a distinct shift of the white point, i.e. the trueness of color of the representation in the display becomes very poor. In order to avoid this, some display manufacturers define the lifetime as the 70% or 90% lifetime (i.e. decline in the starting brightness to 70% or 90% of the starting value). However, this leads to the lifetime becoming even shorter.
3. Although the efficiencies of OLEDs are acceptable, improvements are still of course desired here too, specifically for portable applications.
4. The color coordinates of OLEDs, specifically of broadband white-emitting OLEDs consisting of all three base colors, are not good enough. Particularly the combination of good color coordinates with high efficiency has to be improved.
5. The aging processes are generally accompanied by a rise in the voltage. This effect makes voltage-driven organic electroluminescent devices, for example displays or display elements, difficult or impossible. However, voltage-driven addressing is more complex and costlier precisely in this case.
6. The required operating voltage is quite high specifically in the case of efficient phosphorescent OLEDs and therefore has to be reduced in order to improve the power efficiency. This is of great significance specifically for portable applications.
7. The required operating current has likewise been reduced in the last few years, but has to be reduced still further in order to improve the power efficiency. This is particularly important specifically for portable applications.

The reasons mentioned above under 1 to 7 make improvements in the production of OLEDs necessary.

A development in this direction which has emerged in recent years is the use of organometallic complexes which exhibit phosphorescence instead of fluorescence [M. A. Baldo, S. Lamansky, P. E. Burrows, M. E. Thompson, S. R. Forrest, Appl. Phys. Lett. 1999, 75, 4-6].

For quantum-mechanical reasons, up to four times the quantum efficiency, energy efficiency and power efficiency are possible using organometallic compounds. Whether this new development will establish itself firstly depends strongly upon whether corresponding device compositions can be found which can also utilize these advantages (triplet emission=phosphorescence compared to singlet emission=fluorescence) in OLEDs. The essential conditions for practical use here are in particular a high operative lifetime, a high stability against thermal stress and a low use and operating voltage in order to enable mobile applications.

The general structure of organic electroluminescent devices is described, for example, in U.S. Pat. No. 4,539,507 and U.S. Pat. No. 5,151,629, and also EP 01202358.

Typically, an organic electroluminescent device consists of a plurality of layers which are applied by means of vacuum methods or various printing methods, in particular solution-based printing methods such as inkjet printing, or solvent-free printing methods such as thermal transfer printing or LITI (laser-induced thermal imaging). These layers are specifically:

1. A carrier plate=substrate (typically glass or plastics film).
2. A transparent anode (typically indium tin oxide, ITO).
3. A hole injection layer (Hole Injection Layer=HIL): for example based on copper-phthalocyanine (CuPc) or conductive polymers such as polyaniline (PANI) or polythiophene derivatives (such as PEDOT).
4. One or more hole transport layers (Hole Transport Layer=HTL): typically based on triarylamine derivatives, for example 4,4',4"-tris(N-1-naphthyl-N-phenylamino)triphenylamine (NaphDATA) as the first layer and N,N'-di(naphth-1-yl)-N,N'-diphenylbenzidine (NPB) as the second hole transport layer.
5. One or more emission layers (Emission Layer=EML): this layer (or layers) may coincide partly with layers 4 to 8, but consists typically of matrix materials, such as 4,4'-bis(carbazol-9-yl)biphenyl (CBP), doped with fluorescent dyes, for example N,N'-diphenylquinacridone (QA), or phosphorescence dyes, for example tris(2-phenylpyridyl)iridium (Ir(PPy)$_3$) or tris(2-benzothiophenylpyridyl)iridium (Ir(BTP)$_3$). However, the emission layer may also consist of polymers, mixtures of polymers, mixtures of polymers and low molecular weight compounds or mixtures of different low molecular weight compounds.

6. A hole blocking layer (Hole Blocking Layer=HBL): this layer may coincide partly with layers 7 and 8. It consists typically of BCP (2,9-dimethyl-4,7-diphenyl-1,10-phenanthroline=bathocuproin) or bis(2-methyl-8-quinolinolato))-4-(phenylphenolato)aluminum(III) (BAlq).

7. An electron transport layer (Electron Transport Layer=ETL): usually based on aluminum tris-8-hydroxyquinolate (AlQ$_3$).

8. An electron injection layer (Electron Injection Layer=EIL): this layer may coincide partly with layers 4, 5, 6 and 7, or a small portion of the cathode is specially treated or specially deposited.

9. A further electron injection layer (Electron Injection Layer=EIL): a thin layer consisting of a material having a high dielectric constant, for example LiF, Li$_2$O, BaF$_2$, MgO, NaF.

10. A cathode: here, generally metals, metal combinations or metal alloys having a low work function are used, for example Ca, Ba, Cs, Mg, Al, In, Mg/Ag.

This whole device is appropriately (depending on the application) structured, contacted and finally also hermetically sealed, since the lifetime of such devices is generally shortened drastically in the presence of water and/or air. The same also applies to what are known as inverted structures in which the light is emitted from the cathode. In these inverted OLEDs, the anode consists, for example, of Al/Ni/NiOx or Al/Pt/PtOx or other metal/metal oxide combinations which have a HOMO greater than 5 eV. The cathode consists of the same materials as described in point 9 and 10, with the difference that the metal, for example Ca, Ba, Mg, Al, In, etc., is very thin and thus transparent. The layer thickness is below 50 nm, better below 30 nm, even better below 10 nm. A further transparent material can also be applied to this transparent cathode, for example ITO (indium tin oxide), IZO (indium zinc oxide), etc.

Organic electroluminescent devices in which the emission layer (EML) consists of more than one substance have already been known for some time, as have organic electroluminescent devices in which more than one layer contributes to the overall emission and generates a mixed color:

EP 1182244 describes OLEDs which emit white light, in which the fluorescent compounds stem from the group of the fluoranthenes, pentacenes or perylenes. In this case, the white emission is generated in a layer composed of two spectral components, blue and yellow-orange. This makes the white-emitting OLED unsuitable for producing an RGB display with the aid of color filters, since the red fraction in the spectrum is much too small.

Moreover, small dopant concentrations of 0.1-2.6% are specified in the production of the EML. In industrial manufacture of white-emitting OLEDs, this cannot be accomplished with sufficient reproducibility, since even very small variations in the concentration, both in absolute and relative terms, have an extremely great influence on the white color. For instance, the emission color can easily be shifted into the yellow-orange or blue.

In addition to the degree of doping, the color of an OLED also depends greatly on the operating voltage in the case of low concentrations of a dopant. In the case of an increase in the voltage, as is required, for example, in order to increase the brightness, a distinct shift of the emission into the blue is frequently observed, which in no way makes possible maintenance of the white point over a relatively large brightness range.

EP 1286569 describes OLEDs which emit white light, in which the fluorescent compounds stem from the group of the anthracenes, perylenes, tetracenes or other fused aromatics. In this case, the white emission is obtained from two to three spectral components, blue, yellow-orange and in some cases also, green. Here too, this makes the white-emitting OLEDs unsuitable for producing an RGB display with the aid of color filters, since the red fraction in the spectrum is much too small.

Moreover, small dopant concentrations of 0.12-3% are specified in the production of the EML. In industrial manufacture of white-emitting OLEDs, this cannot be accomplished with sufficient reproducibility, since a small variation in the concentration has an extremely great influence on the white color. For instance, the emission color can easily be shifted into the yellow-orange or blue. The maximum efficiency here is 5 cd/A. For fluorescent OLEDs, relatively high voltages, up to 7.5 V, are observed. The high voltages arise here since either the HTL or ETL is doped with a fluorescent emitter. This forms what are known as traps, which distinctly worsen the transport properties of this layer intended for transport and increase the operating voltage.

US 2003/0099860 describes OLEDs which emit white light, in which the fluorescent compounds are a phenylene-vinylene derivative (DPVBi), DCM2 and C6. In this case, the white emission is generated from two to three spectral components, blue, yellow-orange and green. Here too, this makes the white-emitting OLED unsuitable for producing an RGB display with the aid of color filters, since the red fraction in the spectrum is much too small.

Moreover, small dopant concentrations of 0.01-0.2% are specified in the production of the EML. In industrial manufacture of white-emitting OLEDs, this cannot be accomplished with sufficient reproducibility, since a small variation in the concentration has an extremely great influence on the white color. For instance, the emission color can easily be shifted into the yellow-orange or blue. In addition to the degree of doping, the color of an OLED also depends greatly on the operating voltage in the case of low concentrations of a dopant. In the case of an increase in the voltage, as is required, for example, in order to increase the brightness, a distinct shift of the emission into the blue is frequently observed, which in no way makes possible maintenance of the white point over a relatively large brightness range.

Here, too, the ETL is doped with a fluorescent emitter, which leads to a worsening of the electron transport and an unnecessary increase in the operating voltages.

WO 03/103341 describes white-emitting OLEDs which comprise two or more emitting compounds in the emission layer, of which at least one compound phosphoresces. Here, too, low dopant concentrations in the EML are specified. In industrial manufacture of white-emitting OLEDs, this cannot be realized with sufficient reproducibility. It is also stated that the OLEDs emit white light, but since neither color coordinates nor efficiencies are reported, it can be assumed that they are not sufficiently good.

It is clear from this description of the state of the art that specifically the efficient generation of white light (or of a broadband emission) has to date not been possible to a sufficient extent. It has how been found that, surprisingly, OLEDs which have the inventive features detailed hereinbelow have distinct improvements over this prior art.

The invention therefore provides an organic electroluminescent device (referred to below as OLED), comprising cathode, anode and at least two mutually delimited emission layers which emit different light wavelengths, at least one phosphorescent emitter being present in at least one emission layer.

Apart from the at least two emission layers, the organic electroluminescent device may also comprise further organic layers. These may, for example, be one or more hole injection and/or hole transport layers. It is equally possible for one or more electron injections and/or electron transport layers to be present.

The inventive OLED is illustrated by the scheme which follows, although, as described above, an ETL, HTL and/or HIL need not necessarily be present, or, on the other hand, it is also possible for a plurality of such layers to be present:

| cathode |
| ETL |
| HBL |
| EML2 |
| EML1 |
| HTL2 |
| HTL1 |
| HIL |
| anode |

When the light-emitting materials is these emission layers are selected in such a way that at least one blue, green and red, preferably at least one deep blue, deep green and deep red, component is present, it is possible to particularly efficiently set all desired colors. By means of the variation of the individual layer thicknesses, it is possible to generate and adjust all colors present by virtue of the base colors.

In the context of the invention, "capable of emission" means that the emitting substance, as a pure film, or, if appropriate, as a dopant in a matrix material in an OLED, has an emission of light in the range from 380 nm to 750 nm.

BRIEF DESCRIPTION OF DRAWINGS

FIGS. 1-4 show the emission spectra from the disclosed OLEDs.

Preferably, each emission layer alone exhibits the emission of precisely one emitter.

A preferred embodiment is an above-described OLED having three mutually delimited emission layers.

The inventive OLED is illustrated by the scheme which follows, although, as described above, ETL, HTL and/or HIL need not necessarily be present, or, on the other hand, it is also possible for a plurality of such layers to be present:

| cathode |
| ETL |
| HBL |
| EML3 |
| EML2 |
| EML1 |
| HTL2 |
| HTL1 |
| HIL |
| anode |

By means of the variation of the individual layer thicknesses, all colors present in this color triangle can be generated and set.

A preferred embodiment is an OLED as described in the above section with red, green and blue emission layer. By means of the variation of the individual layer thicknesses of the blue, green and/or red layer, all colors present in this color triangle can be generated and set. The white color impression can thus be generated particularly efficiently.

In the context of the invention, an emission layer (EML) comprises both layers in which emitters are present as pure materials and layers in which a plurality of compounds are present in a dopant-matrix system, the weight ratio of matrix material to emitter being from 99:1 to 1:99, preferably from 95:5 to 5:95.

A preferred embodiment is an above-described OLED, characterized in that the phosphorescent emitter present is a compound which has at least one atom of atomic number greater than 38 and less than 84, preferably greater than 56 and less than 80.

A particularly preferred embodiment is an above-described OLED, comprising, as an emitter, at least one compound, characterized in that the element of atomic number greater than 56 and less than 80 is molybdenum, tungsten, rhenium, ruthenium, osmium, rhodium, iridium, palladium, platinum, silver, gold or europium, for example according to the patent applications WO 98/01011, US 02/0034656, US 03/0022019, WO 00/70655, WO 01/41512, WO 02/02714, WO 02/15645, EP 1191613, EP 1191612, EP 1191614, WO 03/040257 and WO 03/084972.

A preferred embodiment is an above-described OLED, characterized in that the phosphorescent emitter is doped into one or more matrices which are disclosed in the patent applications WO 00/057676, EP 01/202358, WO 02/074015, DE 10317556.3 and DE 10330761.3. In addition to the materials cited above, silanes are also suitable as further matrix materials.

The matrix material present in the above-described mixtures is at least one compound of the formula (1)

formula (1)

where the symbols are each defined as follows:

X is O;

$R^1$, $R^2$ is the same or different at each instance and is an aromatic or heteroaromatic system having from 1 to 40 carbon atoms, in which one or more hydrogen atoms may be replaced by F, Cl, Br, I, and which may be substituted by one or more R radicals, and a plurality of substituents $R^1$ and/or $R^1$, $R^2$, either on the same ring or on the two different rings, may together in turn form a further mono- or polycyclic, aliphatic or aromatic ring system; with the proviso that R1=R2 and is not hydrogen;

R is the same or different at each instance and is H, CN, a straight-chain, branched or cyclic alkyl, alkoxy or alkylamino group having from 1 to 40 carbon atoms, in which one or more nonadjacent $CH_2$ groups may be replaced by —$R^4C$=$CR^4$—, C=O, C=S, C=Se, C=$NR^4$, —O—, —S—, —$NR^5$— or —$CONR^6$—, and in which one or more hydrogen atoms may be replaced by F, Cl, Br, I;

$R^4$, $R^5$, $R^6$ are the same or different at each instance and are H or an aliphatic or aromatic hydrocarbon radical having from 1 to 20 carbon atoms.

A further preferred embodiment is an above-described OLED, characterized in that at least one of the emission layers has a nonphosphorescent emitter. Particular preference is given in this context to an emission layer based on electrofluorescence, in particular one in the blue spectral region. A particularly preferred embodiment in this context is an OLED comprising a nonphosphorescent emitter from the classes of the styrylamines, for example according to the patent applications EP 01314715 and EP 1167488, of the coumarins, anthracenes, pyrenes, perylenes, oligoacenes, dicyanomethanes, for example according to the patent applications EP 1182244, EP 1286569 and WO 00/0121729, of the spiro compounds, for example according to the patent applications EP 676461 and WO 99/40051, and heterocycles, for example according to the patent application WO04/002970, or the complexes and further fluorescent emitters described in the patent application DE 10310887.4.

A particularly preferred embodiment is an above-described OLED, characterized in that at least one hole blocking layer (HBL) is additionally present between at least two emission layers.

This embodiment is illustrated in the scheme which follows, although, as described above, an ETL, HTL and/or HIL need not necessarily be present, or, on the other hand, it is also possible for a plurality of such layers to be present:

cathode
ETL
HBL3
EML3
HBL2
EML2
HBL1
EML1
HTL2
HTL1
HIL
anode

A preferred embodiment is an above-described OLED, characterized in that the hole blocking materials (HBM) used are compounds from the classes of the azaphenanthrenes (e.g. BCP), for example according to the patent application US 02/0034656, of the metal chelate complex (e.g. B-Alq), for example according to the patent applications EP 01308494 and WO 03/022007, certain metal complexes, for example according to the patent application DE 10310887.4, and of the spirophenylenes, for example according to the patent applications EP 676461, WO 99/40051 and DE 10357317.8.

A preferred embodiment is an above-described OLED, characterized in that at least one electron blocking layer (EBL) is additionally present between at least two emission layers, although, as described above, an ETL, HTL and/or HIL need not necessarily be present, or, on the other hand, it is also possible for a plurality of such layers to be present.

cathode
ETL
EBL3
EML3
EBL2
EML2
EBL1
EML1
HTL2
HTL1
HIL
anode

A preferred embodiment is an above-described OLED, characterized in that at least one electron blocking layer (EBL) and at least one hole blocking layer (HBL) are additionally present between at least two emission layers.

This embodiment is illustrated in the schemes which follow, although, as described above, an ETL, HTL and/or HIL need not necessarily be present, or, on the other hand, it is also possible for a plurality of such layers to be present:

cathode
ETL
HBL2
EML3
HBL1
EML2
EBL1
EML1
HTL2
HTL1
HIL
anode cathode
ETL
HBL2
EML3
HBL1
EML2
EBL2
EML1
EBL1
HTL2
HTL1
HIL
anode A preferred embodiment is an above-described OLED, characterized in that the electron blocking materials (EBM) used are compounds from the classes of the triarylamines, for example according to the patent applications EP 01314715 and EP 1167488, of the spirotriarylamines, for example according to the patent applications WO 97/10617, WO 99/12888 and EP 968175, and of the phthalocyanines, for example according to WO 03/022007.

The applications cited in the preceding paragraphs are hereby incorporated by reference in their entirety.

In the inventive OLEDs, the layer thicknesses of the mutually delimited emission layers are selected generally within the range from 1 to 150 nm, preferably within the range from 3 to 100 nm, more preferably within the range from 5 to 50 nm.

In the inventive OLEDs, the layer thicknesses of the hole transport, and also of the electron transport and hole blocking layers, where present, are selected generally within the range from 1 to 150 nm.

Preferred embodiments of the inventive OLEDs are those in which the glass transition temperature $T_g$ of the particular dopants is greater than 90° C., preferably greater than 100° C., more preferably greater than 120° C.

A likewise preferred embodiment is that in which the glass transition temperature $T_g$ of the particular matrix is greater than 90° C., preferably greater than 120° C., more preferably greater than 130° C.

It is particularly preferred when the high glass transition temperature described is present simultaneously both for the matrix materials and hole blocking materials, and for the emission materials and dopants.

The above-described broadband-emitting devices have the following surprising advantages over the state of the art:
1. The efficiency of corresponding devices becomes higher in comparison to systems which do not follow the inventive design.
2. The color coordinates and the color reproduction described by the color rendering index (CRI) becomes better, since a broadband emission is generated which extends from deep blue to deep red. Use of color filters to generate an RGB display is readily possible.
3. The concentration of the dopants barely influences the color coordinates.
4. The tolerance of the emission color with regard to the operating current and the operating voltage is very large.
5. The operating voltage is not increased.
6. With deep red and efficient phosphorescent emitters (for example $Ir(piq)_3$), the filter losses for red are very low and the efficiency is thus very high.
7. With deep green and efficient phosphorescent emitters (for example $Ir(PPy)_3$), the filter losses for green are very low and the efficiency is thus very high.
8. With blue and efficient phosphorescent emitters (for example $Ir(F_2CNPPy)_3$), the filter losses for blue are very low and the efficiency is thus very high.
9. With deep blue and efficient fluorescent emitters, the filter losses for blue are very low and the efficiency is thus very high.

The inventive device structure can be achieved with various application methods. On the one hand, it is possible to apply all layers in vacuum; on the other hand, individual layers can be applied from solution, followed by layers which are in turn applied in vacuum. It is also possible to apply all layers from solution. In the case of application in vacuum, shadow masks serve for structuring, while different printing processes in particular can be employed from solution. In the context of the invention, printing processes also include those that start from the solid state, such as thermal transfer printing or LITI. In the case of the solvent-based processes, solvents are used which dissolve the substances used. The type of substance is not crucial to the invention. It is possible with preference to use substances having molecular weights of <1500 g/mol when vacuum application is selected. At MW>1500 g/mol, it is possible to use polymeric substances (linear, branched, hyper-branched, dendritic, macrocyclic). It has also been found to be useful to use crosslinkable substances, in which case the possibility of photostructuring exists.

Details on the remarks made here can be found in the examples described below.

The present application, and also the examples which follow below are aimed only at organic light-emitting diodes and the corresponding displays. In spite of this restriction of the description, it is possible for those skilled in the art without any further inventive activity to use the corresponding inventive structure also for other related devices, for example for organic solar cells (O-SCs), organic field-effect transistors (O-FETs) or else organic laser diodes (O-lasers), to name just a few further applications.

EXAMPLES

Production and Characterization of Organic Electroluminescent Devices which Correspond to the Inventive Structure.

OLEDs were produced by a general process which is described, for example, in the unpublished application DE 10317556.3. The process has to be adapted in the individual case to the particular circumstances (for example layer thickness variation to achieve optimal efficiency and color).

The emission layer essential to the invention (Emission Layer=EML) comprises at least two individual layers which each have a different emission color and are applied to one another. Further layers, for example hole blocking layers, may also lie between these individual layers as described above. The individual layers consist, for example, of a low molecular weight host material and a low molecular weight guest material, the light-emitting dopant, for example CBP or other matrix materials as the host material and $Ir(PPy)_3$ as the dopant in the case of the green emitter layer. Instead of low molecular weight light-emitting compounds, it is also possible to use high molecular weight light-emitting compounds (polymers), in which case one or even both components of the host-guest system may have a high molecular weight.

Device Examples

In these examples, the results of various OLEDs are presented. The fundamental structure, such as the materials and layer thicknesses used, apart from the EML and the HBLs, were identical for better comparability. Exclusively the structure of the EML and accompanying HBLs were varied in the examples.

Analogously to the abovementioned general process, broadband emitting OLEDs with the following structure were obtained.

PEDOT 60 nm (spincoated from water; PEDOT purchased from H. C. Starck; poly[3,4-ethylenedioxy-2,5-thiophene]

NaphDATA 20 nm (applied by vapor deposition; NaphDATA purchased from SynTec; 4,4',4"-tris(N-2-naphthyl)-N-phenylamino)-triphenylamine S-TAD 20 nm (applied by vapor deposition; S-TAD prepared according to WO99/12888; 2,2',7,7'-tetrakis(diphenylamino)spirobifluorene)

Emitter layer: see examples for precise structure

HBM see examples $AlQ_3$ 10 nm (applied by vapor deposition: $AlQ_3$ purchased from SynTec; Tris(quinolinolato)aluminum(III))

Ba—Al 3 nm of Ba, 150 nm of Al thereon as the cathode

These OLEDs which were yet to be optimized were characterized in a standard manner; for this purpose, the electroluminescence spectra, the efficiency (measured in cd/A) as a function of brightness, calculated from current-voltage-brightness characteristics (IUL characteristics), and the lifetime were determined.

Table 1 summarizes the results of examples 1 to 4. The composition of all of the EMLs and HBLs including the corresponding layer thicknesses is listed. The doped phosphorescent EMLs all comprise bis(9,9'-spirobifluorene-2-yl) ketone as the matrix material (synthesis according to DE 10317556.3); in table 1, merely the emitter is listed. The abbreviations used in table 1 correspond to the following compounds:

TABLE 1

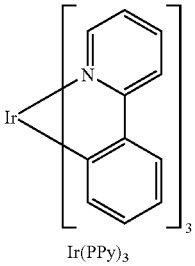

| Example | EML1 | HBL1 | EML2 | HBL2 | EML3 | HBL3 | Efficiency (cd/A) | Voltage (V) at 100 cd/m² | CIE |
|---|---|---|---|---|---|---|---|---|---|
| Example 1 | S-DPVBi (10 nm) | — | 20% F-Irpiq (10 nm) | — | 20% Ir(ppy)₃ (10 nm) | BCP (10 nm) | 12 | 8.5 | x = 0.31; y = 0.33 (cf. FIG. 1) |
| Example 2 | S-DPVBi (10 nm) | — | 20% Ir(ppy)₃ (10 nm) | BCP (4 nm) | 20% F-Irpiq (10 nm) | BCP (8 nm) | 15 | 8.0 | x = 0.33; y = 0.36 (cf. FIG. 2) |
| Example 3 | S-DPVBi (10 nm) | — | 20% F-Irpiq (10 nm) | BCP (8 nm) | | | 8 | 8.0 | x = 0.34; y = 0.28 (cf. FIG. 3) |
| Example 4 | S-DPVBi (10 nm) | BCP (5 nm) | 20% Ir(ppy)₃ (10 nm) | BCP (5 nm) | 20% F-Irpiq (10 nm) | BCP (10 nm) | 18 | 8.5 | x = 0.36; y = 0.39 |

In summary, it can be stated that pure white emission resulting from all emitters present was observed for all OLEDs. The corresponding emission spectra are shown below (FIGS. 1 to 3).

Example 5

Color as a Function of Current

By way of example, the stability of color with respect to an increase in the voltage or in the current will be shown with reference to the emission spectra. In this example, an OLED according to example 2 was used. FIG. 4 shows three spectra in which the current was increased from 1 mA via 3 mA to 5 mA. This changed the CIE coordinates from x=0.36, y=0.39 to x=0.33, y=0.36, which only corresponds to a very small change.

What is claimed is:

1. An organic electroluminescent device, comprising:
   cathode;
   anode;
   at least two mutually delimited emission layers, said emission layers emitting different light wavelengths,
   wherein at least one emission layer further includes at least one phosphorescent emitter and a matrix material represented by the following formula

wherein:

X is O;

R¹, R² is the same or different at each instance and is an aromatic or heteroaromatic system having from 1 to 40 carbon atoms, in which one or more hydrogen atoms may be replaced by F, Cl, Br, I, and which may be substituted by one or more R radicals, and a plurality of substituents R¹ and/or R¹, R², either on the same ring or on the two different rings, may together in turn form a further mono- or polycyclic, aliphatic or aromatic ring system; with the proviso that R1=R2 and is not hydrogen;

R is the same or different at each instance and is H, CN, a straight-chain, branched or cyclic alkyl, alkoxy or alkylamino group having from 1 to 40 carbon atoms, in which one or more nonadjacent $CH_2$ groups may be replaced by —$R^4C$=$CR^4$—, C=O, C=S, C=Se, C=$NR^4$, —O—, —S—, —$NR^5$— or —$CONR^6$—, and in which one or more hydrogen atoms may be replaced by F, Cl, Br, I;

$R^4$, $R^5$, $R^6$ are the same or different at each instance and are H or an aliphatic or aromatic hydrocarbon radical having from 1 to 20 carbon atoms.

2. The organic electroluminescent device as claimed in claim 1, further including additional layers.

3. The organic electroluminescent device as claimed in claim 1 wherein the additional layers include hole injection and/or hole transport layers.

4. The organic electroluminescent device as claimed in claim 1, wherein the additional layers include electron injection and/or electron transport layers.

5. The organic electroluminescent device as claimed in claim 1, wherein the device exhibits emission of light in the range from 380 nm to 750 nm.

6. The organic electroluminescent device as claimed in claim 1, wherein said device comprises three mutually delimited emission layers.

7. The organic electroluminescent device as claimed in claim 6, wherein the three mutually delimited emission layers have the emission colors red, green and blue.

8. The organic electroluminescent device as claimed in claim 1, wherein the emission layers comprise both layers in which emitters are present as pure materials and layers in which a plurality of compounds are present in a dopant matrix system, the weight ratio of matrix material to emitter being from 99:1 to 1:99.

9. The organic electroluminescent device as claimed in claim 1, wherein the phosphorescent emitter is a compound having at least one atom of atomic number greater than 38 and less than 84.

10. The organic electroluminescent device as claimed in claim 9, wherein the phosphorescent emitter comprises molybdenum, tungsten, rhenium, ruthenium, osmium, rhodium, iridium, palladium, platinum, silver, gold or europium.

11. The organic electroluminescent device as claimed in claim 1, wherein at least one of the emission layers further comprises at least one nonphosphorescent emitter.

12. The organic electroluminescent device as claimed in claim 11, wherein said least one nonphosphorescent emitter comprises at least one of the styrylamines, coumarins, anthracenes, pyrenes, perylenes, oligoacenes, dicyanomethanes, compounds having spiro centers, heterocycles or metal complexes.

13. The organic electroluminescent device as claimed in claim 1, further including at least one hole blocking layer (HBL) disposed between the at least two emission layers.

14. The organic electroluminescent device as claimed in claim 13, wherein the HBL comprises at least one hole blocking material (HBM) selected from the azaphenanthrenes, metal chelate complexes, metal complexes or spirophenylenes.

15. The organic electroluminescent device as claimed in claim 1, further including at least one electron blocking layer (EBL) disposed between the at least two emission layers.

16. The organic electroluminescent device as claimed in claim 15, wherein the EBL comprises at least one electron blocking materials (EBM) selected from the triarylamines, spirotriarylamines or the phthalocyanines.

17. The organic electroluminescent device as claimed in claim 1, further including at least one electron blocking layer (EBL) and at least one hole blocking layer (HBL) disposed between the at least two emission layers.

18. The organic electroluminescent device as claimed in claim 1, wherein the mutually delimited emitter layers have a thickness from 1 to 150 nm.

19. The organic electroluminescent device as claimed in claim 4, wherein the electron transport layer has a thickness from 1 to 150 nm.

20. The organic electroluminescent device as claimed in claim 13, wherein the hole blocking layer has a thickness of from 1 to 150 nm.

21. The organic electroluminescent device as claimed in claim 1, further including at least one electron transport layer and at least one hole blocking layer, disposed between the at least two emission layers, wherein said at least one electron transport layer, at least one hole blocking layer and said emitter layers each have a different thickness in the range from 1 to 150 nm.

22. The organic electroluminescent device as claimed in claim 1, wherein the glass transition temperature Tg of the at least two emitter layers is greater than 90° C.

23. The organic electroluminescent device as in claim 8, wherein the glass transition temperature Tg of the matrix materials of the emission layers is greater than 100° C.

24. The organic electroluminescent device as claimed in claim 1, wherein the glass transition temperature Tg of any layer is greater than 90° C.

* * * * *